(12) United States Patent
Iwasaki et al.

(10) Patent No.: US 7,012,312 B2
(45) Date of Patent: Mar. 14, 2006

(54) SEMICONDUCTOR DEVICE WITH MULTILAYER CONDUCTIVE STRUCTURE FORMED ON A SEMICONDUCTOR SUBSTRATE

(75) Inventors: Tomio Iwasaki, Tsuchiura (JP); Hideo Miura, Tsuchiura (JP); Isamu Asano, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/611,862

(22) Filed: Jul. 3, 2003

(65) Prior Publication Data

US 2004/0089947 A1    May 13, 2004

Related U.S. Application Data

(63) Continuation of application No. 09/787,528, filed as application No. PCT/JP00/00072 on Jan. 13, 2000, now Pat. No. 6,624,513.

(30) Foreign Application Priority Data

Jan. 13, 1999  (JP) .................................. 11-006108

(51) Int. Cl.
*H01L 23/532* (2006.01)
(52) U.S. Cl. ...................... 257/412; 257/413; 257/762; 257/769
(58) Field of Classification Search ................ 257/412, 257/413, 762, 766, 768, 769, 774; 438/620
See application file for complete search history.

(56) References Cited

U.S. PATENT DOCUMENTS

| | | | |
|---|---|---|---|
| 4,803,539 A * | 2/1989 | Psaras et al. ................ 257/742 |
| 4,935,805 A | 6/1990 | Calviello et al. | |
| 5,504,351 A | 4/1996 | Anderson | |
| 5,510,651 A | 4/1996 | Manlar et al. | |
| 5,792,703 A * | 8/1998 | Bronner et al. ............. 438/620 |
| 5,824,599 A * | 10/1998 | Schacham-Diamand et al. ........................... 438/678 |
| 5,969,422 A | 10/1999 | Ting et al. | |
| 6,054,331 A | 4/2000 | Woo et al. | |

(Continued)

FOREIGN PATENT DOCUMENTS

JP          05-315336           11/1993

(Continued)

OTHER PUBLICATIONS

Nikkei Microdevices, Jun. 1992 issue, pp. 74-77.

(Continued)

*Primary Examiner*—Stephen W. Smoot
(74) *Attorney, Agent, or Firm*—Antonelli, Terry, Stout and Kraus, LLP.

(57) ABSTRACT

A highly reliable semiconductor device having a multilayer structure including an insulating film, an adjacent conductive film, and a main conductive film in which adhesive fractures, voids and disconnections are unlikely to occur. Regarding main constituent elements of the adjacent conductive film and the main conductive film, lattice mismatching is made small, the melting point the adjacent conductive film is set to be not less than 1.4 times that of the main constituent element of the main conductive film, the adjacent conductive film contains at least one different kind of element, the difference between the atomic radius of an added element and that the atomic radius the adjacent conductive film is set to be not more than 10%, and/or bond energy between the added element and silicon (Si) is not less than 1.9 times that of the main constituent element of the adjacent conductive film and silicon (Si).

12 Claims, 9 Drawing Sheets

U.S. PATENT DOCUMENTS

| | | |
|---|---|---|
| 6,271,559 B1 | 8/2001 | Iwasaki et al. |
| 6,278,164 B1 * | 8/2001 | Hieda et al. ................. 257/410 |
| 6,399,496 B1 | 6/2002 | Edelstein et al. |
| 6,624,513 B1 * | 9/2003 | Iwasaki et al. ............. 257/753 |
| 2001/0000926 A1 | 5/2001 | Andricacos et al. |
| 2004/0238965 A1 * | 12/2004 | Iwasaki et al. ............. 257/762 |

FOREIGN PATENT DOCUMENTS

| | | |
|---|---|---|
| JP | 10-229084 | 8/1998 |
| JP | 10-256251 | 9/1998 |
| JP | 11-317455 | 11/1999 |

OTHER PUBLICATIONS

"Introduction to Solid Physics" 1st vol., 5th Ed., Charles Kittel.

"Molecular Dynamics Simulation of Crack Tip Processes in Alpha-Iron and Copper", Journal of Applied Physics, vol. 54 (1983), pp. 4864-4878, B. deCelis et al.

"The Peeling of Flexible Laminates", International Journal of Fracture, vol. 66 (1994), pp. 45-70, A. J. Kinloch et al.

* cited by examiner

SEMICONDUCTOR DEVICE WITH MULTILAYER CONDUCTIVE STRUCTURE FORMED ON A SEMICONDUCTOR SUBSTRATE

This application is a continuation of U.S. application Ser. No. 09/787,528, filed Jun. 26, 2002, now U.S. Pat. No. 6,624,513 which is a Section 371 of International Application PCT/JP00/00072, filed Jan. 13, 2000, and the entire disclosures of which are hereby incorporated by reference.

BACKGROUND OF THE INVENTION

1. Field of the Invention

The present invention relates to a semiconductor device and, more particularly, to a semiconductor device whose wiring structure is formed by a multilayer structure.

2. Prior Art

In conjunction with trends toward higher integration and higher speed of semiconductor devices in recent years, the copper (Cu) wiring, which has a lower electrical resistance than conventional aluminum (Al) wiring, has been introduced. However, if copper (Cu) atoms are diffused and enter a silicon (Si) substrate or an insulating film, there is a possibility of deteriorating the device characteristics, so that an adjacent conductive film (first conductive film) for preventing the diffusion of the copper (Cu) atoms is formed adjacent to a copper (Cu) film. As materials of this adjacent conductive film, high-melting-point metals such as titanium nitride (TiN), tungsten (W), and tantalum (Ta) have been studied, as described in Nikkei Microdevices (June 1992 issue, pp. 74–77). However, if these materials are used as the adjacent conductive film, their adhesion to the plated film of copper (Cu) used for wiring is weak, so that rhodium (Rh), ruthenium (Ru), iridium (Ir), and osmium (Os) have been proposed in Japanese Patent Application Laid-Open Hei 10-229084 (JP-A-10-229084) as materials of the adjacent conductive film for improving the adhesion.

SUMMARY OF THE INVENTION

In the manufacture of semiconductor devices which are finely patterned for higher integration, since there are cases where chemical mechanical polishing (CMP) is employed as a technique for effecting planarization, it is important to improve adhesion between the respective films formed. However, if rhodium (Rh), ruthenium (Ru), iridium (Ir), or osmium (Os) is used as the material of the adjacent conductive film in the copper (Cu) wiring, the adhesion between copper (Cu) and the adjacent conductive film improves, but there is a problem in that the adhesion between the adjacent conductive film and the insulating film is weak. Further, rhodium (Rh), ruthenium (Ru), iridium (Ir), and osmium (Os) are liable to produce high stress during film formation, possibly causing defects such as cracks to occur in an adjacent film. Furthermore, with the semiconductor devices which are finely patterned for higher integration, the wiring width becomes narrow, so that there is a problem in that voids and disconnections due to migration are likely to occur.

A first object of the invention is to provide a highly reliable semiconductor device. A second object of the invention is to provide a semiconductor device having a wiring structure whose yield is high. A third object of the invention is to provide a semiconductor device having a multilayer structure in which adhesive fracture is difficult to occur by the use of highly adhesive adjacent conductive film materials for both a main conductive film forming the wiring and an insulating film. Further, a fourth object of the invention is to provide a semiconductor device having a multilayer structure in which defects such as cracks are difficult to occur. Furthermore, a fifth object of the invention is to provide a semiconductor device in which voids and disconnections due to migration are difficult to occur.

The present inventors have conducted extensive research with regard to overcoming the above-described problems. For example, they discovered that in a case where a first conductive film for diffusion prevention whose main constituent elements are titanium nitride (TiN), tungsten (W), and tantalum (Ta) is used adjacent to a second conductive film whose main constituent element is copper (Cu), since the lengths of sides of the unit crystal cells of the first conductive film and copper (Cu) substantially differ, the atomic arrangement becomes disarrayed at the interface between the first conductive film and the second conductive film, and the diffusion of the copper (Cu) atoms becomes active, so that adhesive fracture is liable to occur. The present inventors discovered that, to prevent the adhesive fracture at the interface between the copper (Cu) film and the first conductive film, it suffices to suppress the diffusion of the copper (Cu) atoms by using as the first conductive film material a material whose length of the side of the unit crystal cell (lattice constant) is close to that of copper (Cu), i.e., a material in which the difference in the lattice constant (lattice mismatching) with copper (Cu) is small. In a case where the melting point of the first conductive film is low, however, the diffusion of the element constituting the first conductive film becomes active, and the diffusion of the copper (Cu) atoms is accelerated, so that a material having a high melting point is suitable.

The present inventors ascertained that it is effective in the improvement of adhesion to copper (Cu) to use as the diffusion-preventing adjacent conductive film a material whose lattice mismatching with copper (Cu) is small and which has a melting point not less than 1.4 times that of copper (Cu). More specifically, the present inventors ascertained that in a multilayer wiring structure comprising a first conductive film and a second conductive film formed in contact with the first conductive film, the diffusion at the main conductive film is suppressed and the adhesion between the first conductive film and the second conductive film improves in a case where the difference $\{|ap-an|/ap\} \times 100 = A(\%)$ between a short side "an" in a unit rectangular cell of a closest packed crystal plane formed by the main constituent element of the first conductive film and a short side "ap" in a unit rectangular cell of a closest packed crystal plane formed by the main constituent element of the second conductive film and the difference $\{|bp-bn|/bp\} \times 100 = B(\%)$ between a long side "bn" in the unit rectangular cell of the closest packed crystal plane formed by the main constituent element of the first conductive film and a long side "bp" in the unit rectangular cell of the closest packed crystal plane formed by the main constituent element of the second conductive film satisfy an inequality $\{A+B \times (ap/bp)\} < 13\%$, and the melting point of the main constituent element of the first conductive film is not less than 1.4 times that of the main constituent element of the second conductive film. Here, the definitions of the short side "a" and the long side "b" of a unit rectangular cell forming the crystal plane where the atomic density is the largest, i.e., the closest packed crystal plane, in a bulk crystal are shown in FIG. 2, and a and b are referred to herein as lattice constants. The short side "a" is the closest interatomic distance in a bulk crystal, and is described on page 28 of "Introduction to Solid Physics,"

1st Vol., 5th Edition (Charles Kittel). In a crystal having a face-centered cubic structure or a closest packed hexagonal structure, the long side "b" is about 1.73 times the short side "a", and in the case of a crystal having a body-centered cubic structure the long side "b" is about 1.41 times the short side "a". Here, the difference A in the short side a and the difference B in the long side b will be referred to as lattice mismatching. Here, the main constituent element of the film means an element which is contained most in the film. Further, kelvin (K) is used as the unit of temperature.

The present inventors ascertained that in a case where the first conductive film formed of rhodium (Rh), ruthenium (Ru), iridium (Ir), osmium (Os), and platinum (Pt) whose lattice mismatching A and B with copper (Cu) are small enough to satisfy the aforementioned inequality $\{A+B\times(ap/bp)\}<13\%$ and which have melting points not less than 1.4 times that of copper (Cu) is used as the adjacent conductive film for the copper (Cu) wiring, the adhesion between the first conductive film and the copper (Cu) film improves. However, rhodium (Rh), ruthenium (Ru), iridium (Ir), osmium (Os), and platinum (Pt) have weak bonds with silicon (Si), and since an insulating film containing silicon (Si) is generally amorphous, a strong bond cannot be obtained between the first conductive film and the insulating film containing silicon (Si), so that adhesive fracture is liable to occur. Accordingly, in order to improve the adhesion between the first conductive film and the insulating film while strongly maintaining the adhesion between the first conductive film and the copper (Cu) film, it suffices if an added element which is strongly bonded to silicon (Si) and does not disarray the atomic arrangement of the first conductive film is contained in the first conductive film whose main constituent elements are rhodium (Rh), ruthenium (Ru), iridium (Ir), osmium (Os), and platinum (Pt).

The present inventors ascertained that the adhesivity between the first conductive film and the insulating film improves in a case where the bond energy between this added element and silicon (Si) is not less than 1.9 times that of the main constituent element of the first conductive film and silicon (Si). Nevertheless, if the difference between the atomic radius of the added element and the atomic radius of the main constituent element such as rhodium (Rh), ruthenium (Ru), iridium (Ir), osmium (Os), and platinum (Pt) becomes not less than 10%, the atomic arrangement of the first conductive film becomes disarrayed, so that the adhesion between the first conductive film and the copper (Cu) film becomes weak. Accordingly, an added element becomes effective in which the difference between the atomic radius of the added element and the atomic radius of the main constituent element of the first conductive film is not more than 10%, and whose bond energy with silicon (Si) is not less than 1.9 times the bond energy between the main constituent element of the first conductive film and silicon (Si). It was ascertained that palladium (Pd), cobalt (Co), nickel (Ni), and titanium (Ti) are effective as added elements which satisfy these conditions. Further, it was ascertained that the inclusion of such added elements is effective in reducing the internal stress in the first conductive film.

Furthermore, the present inventors ascertained that in a case where rhodium (Rh), ruthenium (Ru), iridium (Ir), osmium (Os), and platinum (Pt) whose lattice mismatching A and B with copper (Cu) are small enough to satisfy the aforementioned inequality $\{A+B\times(ap/bp)\}<13\%$ and which have melting points not less than 1.4 times that of copper (Cu) are used as the main constituent elements of the conductive film adjacent to the copper (Cu) film, the diffusion of the copper (Cu) atoms is suppressed, and migration resistance improves.

Namely, to overcome the problems of the invention of this application, the present inventors discovered that it is important to provide a semiconductor device having a multilayer structure comprising on a principle plane side of a semiconductor substrate an insulating film including silicon (Si), a first conductive film formed in contact with the insulating film, and a second conductive film formed in contact with the first conductive film, wherein (i) a difference $\{|ap-an|/ap\}\times 100=A(\%)$ between a short side "an" in a unit rectangular cell of a closest packed crystal plane formed by the main constituent element of the first conductive film and a short side "ap" in a unit rectangular cell of a closest packed crystal plane formed by the main constituent element of the second conductive film and a difference $\{|bp-bn|/bp\}\times 100=B(\%)$ between a long side "bn" in the unit rectangular cell of the closest packed crystal plane formed by the main constituent element of the first conductive film and a long side "bp" in the unit rectangular cell of the closest packed crystal plane formed by the main constituent element of the second conductive film satisfy an inequality $\{A+B\times(ap/bp)\}<13\%$, (ii) a melting point of the main constituent element of the first conductive film is not less than 1.4 times that of the main constituent element of the second conductive film, (iii) the first conductive film contains as an added element at least one different kind of element in addition to the main constituent element, (iv) a difference between an atomic radius of at least one kind of added element among the different kinds of elements and an atomic radius of the main constituent element of the first conductive film is not more than 10%, and (v) a bond energy between the added element and silicon (Si) is not less than 1.9 times that of the main constituent element of the first conductive film and silicon (Si).

DETAILED DESCRIPTION OF THE EXAMPLE EMBODIMENTS

Figure 1:
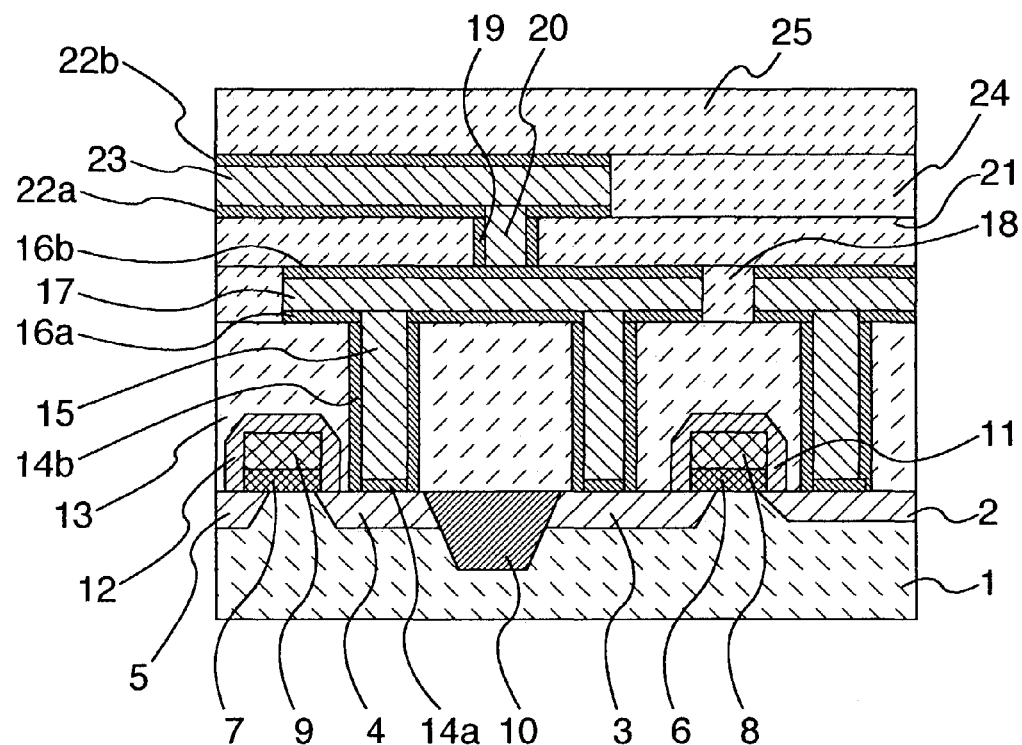
FIG. 1 is a cross-sectional view of principal portions of a semiconductor device in accordance with a first embodiment of the invention.
Figure 2:
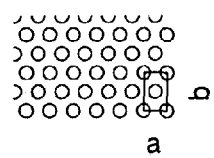
FIG. 2 is a diagram illustrating the atomic arrangement in a closest packed crystal plane and lattice constants a and b of a unit rectangular cell.

Hereafter, a more detailed description will be given for carrying out the invention through the various embodiments shown in the drawings.

First, a cross-sectional structure of principal portions of a semiconductor device in accordance with a first embodiment of the invention is shown in FIG. 1. As shown in FIG. 1, in the semiconductor device of this embodiment, diffusion layers 2, 3, 4, and 5 are formed on a silicon substrate 1, and gate insulating films 6 and 7 and gate electrodes 8 and 9 are formed thereon, thereby forming a MOS transistor. The gate insulating films 6 and 7 are, for example, silicon dioxide films or silicon nitride films, while the gate electrodes 8 and 9 are, for example, polycrystalline silicon films, metal thin films, or metal silicide films, or a laminated structure thereof. The MOS transistor is separated by a device separating film 10 formed of, for example, a silicon dioxide film. Insulating films 11 and 12, which are formed of, for example, silicon dioxide films, are formed on top of the gate electrodes 8 and 9 and on side walls thereof. An insulating film 13, which is formed of, for example, a boron-doped phospho-silicate glass (BPSG) film, a spin-on glass (SOG) film, a silicon dioxide film, a silicon nitride film, or the like formed by chemical vapor deposition or sputtering, is formed on the entire surfaces of the upper portions of the MOS transistor.

Plugs, which are each formed of a main conductive film 15 coated with adjacent conductive films (first conductive films) 14a and 14b for preventing diffusion, are respectively formed in contact holes formed in the insulating film 13, and are connected to the diffusion layers 2, 3, 4, and 5.

A first multilayer interconnection, which is formed of a main conductive film 17 coated with adjacent conductive films 16a and 16b for preventing diffusion, is connected through these plugs. This multilayer interconnection can be obtained by a process in which, for instance, grooves for interconnection are formed in an insulating film 18, and after the adjacent conductive film 16a is formed thereon by such as chemical vapor deposition, the main conductive film 17 is formed by such as plating, followed by the formation of the adjacent conductive film 16b thereon by such as chemical vapor deposition. On top of the first multilayer interconnection, a second plug, which is formed of a main conductive film 20 coated with an adjacent conductive film 19, is formed in a contact hole formed in an insulating film 21, and is connected to the aforementioned multilayer interconnection.

A second multilayer interconnection, which is formed of a main conductive film 23 coated with adjacent conductive films 22a and 22b, is connected through the second plug. This second multilayer interconnection can be obtained by a process in which, for instance, grooves for interconnection are formed in an insulating film 24, and after the adjacent conductive film 22a is formed thereon by such as chemical vapor deposition, the main conductive film 23 is formed by such as plating, followed by the formation of the adjacent conductive film 22b thereon by such as chemical vapor deposition. An insulating film 25 is then formed over the conductive film 22b and the insulating film 24.

In this embodiment, with respect to at least one set among the main conductive film 15 coated with the adjacent conductive films 14a and 14b, the main conductive film 17 coated with the adjacent conductive films 16a and 16b, the main conductive film 20 coated with the adjacent conductive film 19, and the main conductive film 23 coated with the adjacent conductive films 22a and 22b, the constituent elements of the adjacent conductive film are selected such that all of the following requirements are met: (i) that the difference $\{|ap-an|/ap\} \times 100 = A(\%)$ between a short side "an" in a unit rectangular cell of a closest packed crystal plane formed by a main constituent element of the adjacent conductive film and a short side "ap" in a unit rectangular cell of a closest packed crystal plane formed by a main constituent element of the main conductive film and the difference $\{|bp-bn|/bp\} \times 100 = B(\%)$ between a long side "bn" in the unit rectangular cell of the closest packed crystal plane formed by the main constituent element of the adjacent conductive film and a long side "bp" in the unit rectangular cell of the closest packed crystal plane formed by the main constituent element of the main conductive film satisfy the inequality {A+B×(ap/bp)}<13%, (ii) that the melting point of the main constituent element of the adjacent conductive film is not less than 1.4 times that of the main constituent element of the main conductive film, (iii) that the adjacent conductive film contains at least one different kind of element in addition to the main constituent element, (iv) that the difference between the atomic radius of at least one kind of added element among the different kinds of elements and the atomic radius of the main constituent element of the adjacent conductive film is not more than 10%, and (v) that the bond energy between the added element and silicon (Si) is not less than 1.9 times that of the main constituent element of the adjacent conductive film and silicon (Si). Specifically, in a case where the copper (Cu) film is used as the main conductive film, it suffices if the adjacent conductive film has as its main constituent element at least one kind of element selected from rhodium (Rh), ruthenium (Ru), iridium (Ir), osmium (Os), and platinum (Pt), and contains as an added element at least one kind of element selected from palladium (Pd), cobalt (Co), nickel (Ni), and titanium (Ti). The film which is formed of rhodium (Rh), ruthenium (Ru), iridium (Ir), osmium (Os), or platinum (Pt) and contains such an added element is formed by, for instance, chemical vapor deposition, plating, or sputtering.

Hereafter, a description will be given of the effects of the semiconductor device in accordance with this embodiment. Since the effects of improvement of adhesion include the following two effects, a description will be given in two parts.

I. The first effect is that the adhesion between the adjacent conductive film and the main conductive film is improved by providing settings such that the lattice mismatching A and B between the main constituent element of the adjacent conductive film and that of the main conductive film satisfies the aforementioned inequality {A+B×(ap/bp)}<13%, and that the melting point of the main constituent element of the adjacent conductive film is not less than 1.4 times that of the main constituent element of the main conductive film.

II. The second effect is that the adhesion between the adjacent conductive film and the insulating film including silicon (Si) is improved while maintaining the adhesion between the adjacent conductive film and the main conductive film, by providing settings such that the following requirements are met: that the adjacent conductive film contains at least one different kind of element in addition to the main constituent element, that the difference between the atomic radius of at least one kind of added element among the different kinds of elements and the atomic radius of the main constituent element of the adjacent conductive film is not more than 10%, and that the bond energy between the added element and silicon (Si) is not less than 1.9 times that of the main constituent element of the adjacent conductive film and silicon (Si).

First, a detailed description will be given of the first effect of improvement of adhesion.

By taking note of the lattice mismatching A and B between the main constituent element of the adjacent conductive film and that of the main conductive film, the present inventors examined the effect of this difference exerted on the adhesive fracture energy U through a molecular dynamic simulation. The molecular dynamic simulation is a method in which, as described on pages 4864 through 4878 in Vol. 54 (published in 1983) of the Journal of Applied Physics, for example, the force acting in each atom through interatomic potential is calculated, and the position of each atom at each time is calculated by solving Newton's equation of motion on the basis of this force. The adhesive fracture energy U indicates energy necessary for allowing adhesive fracture to take place between the adjacent conductive film and the main conductive film, and is described on pages 45 through 70 of Vol. 66 (published in 1994) of the International Journal of Fracture, for example. In this example of simulation, U is calculated by subtracting the aggregate sum of the interatomic potential inside a system in which the adjacent conductive film is connected to the main conductive film from the amount in which the aggregate sum of the interatomic potential in the main conductive film is added to the aggregate sum of the interatomic potential in the adjacent conductive film. As an example, shown below is the result of simulation in the case where the main conductive film is the copper (Cu) film. In this case, the closest packed crystal plane of copper (Cu) having a face-centered cubic lattice is the (111) plane, the lattice constant ap is approximately 0.26 nm, and the lattice constant bp is approximately 0.44 nm.

In the example of simulation shown here, at a temperature of 900°K, constituent atoms of the adjacent conductive film were deposited on an $SiO_2$ film having a thickness of 3 nm, and Cu atoms were then deposited thereon, thereby forming an adjacent conductive film with a thickness of 3 nm and a Cu film with a thickness of 3 nm. Subsequently, the temperature was lowered to 300°K. In this state, the adhesive fracture energy U was calculated by subtracting the aggregate sum of the interatomic potential inside a system comprising both the adjacent conductive film and the Cu film from the amount in which the aggregate sum of the interatomic potential in the Cu film was added to the aggregate sum of the interatomic potential in the adjacent conductive film. In the molecular dynamic simulation, by varying the depth of the interatomic potential of the constituent element of the adjacent conductive film, it is possible to vary the melting point of the adjacent conductive film while maintaining the lattice constant of the adjacent conductive film at a fixed level.

Figure 3:
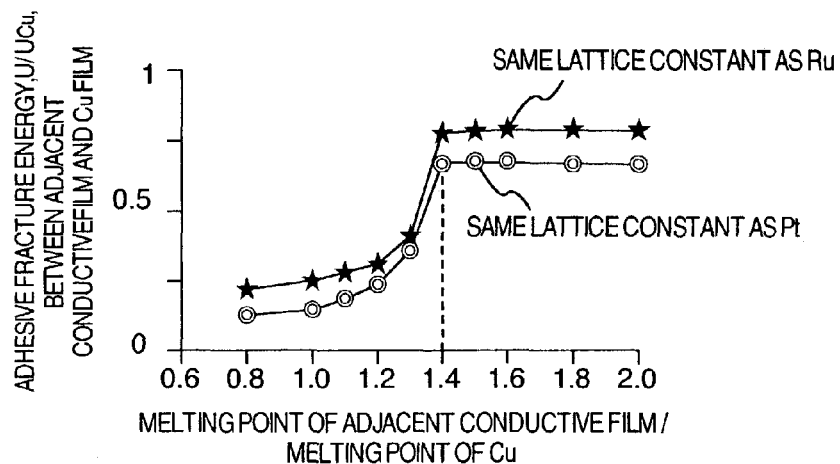
FIG. 3 is a diagram illustrating the melting-point dependence of the adhesive fracture energy between the adjacent conductive film and the main conductive film in a case where a copper (Cu) film was used as the main conductive film.

As a result of varying the melting point of the adjacent conductive film while maintaining the lattice constant of the adjacent conductive film at the same levels as those of Ru and Pt, it was found that when the melting point of the adjacent conductive film is not less than 1.4 times that of copper (Cu), the adhesive fracture energy U is substantially not dependent on the melting point of the adjacent conductive film, as shown in FIG. 3. Furthermore, it was also found that, as can be seen from FIG. 3, when the melting point of the adjacent conductive film becomes smaller than 1.4 times that of copper (Cu), the adhesive fracture energy U becomes small, and the adhesive fracture strength becomes weak. In FIG. 3, $U_{Cu}$ denotes the adhesive fracture energy between the copper (Cu) film and the copper (Cu) film.

Figure 4:
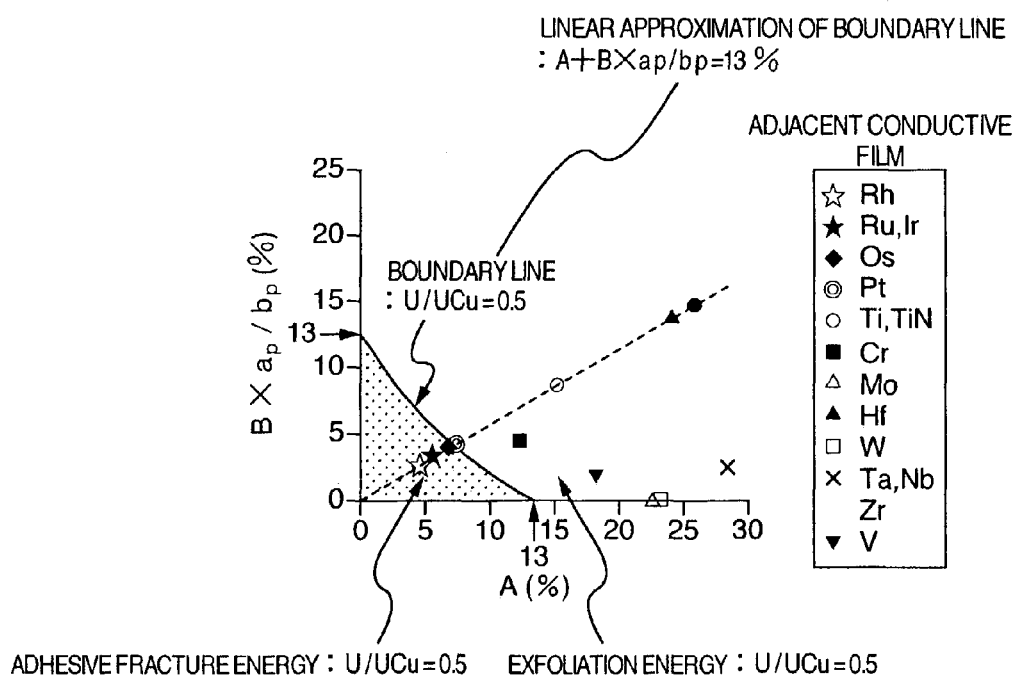
FIG. 4 is a diagram illustrating the lattice mismatching dependence of the adhesive fracture energy between the adjacent conductive film and the main conductive film in the case where the copper (Cu) film was used as the main conductive film.
Figure 5:
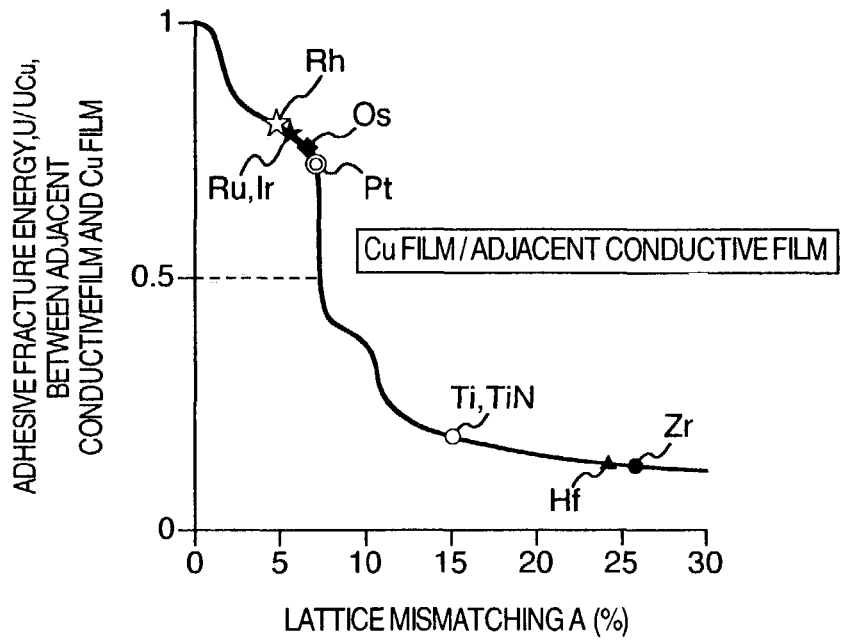
FIG. 5 is a diagram illustrating along the broken line in FIG. 4 the lattice mismatching dependence of the adhesive fracture energy between the adjacent conductive film and the main conductive film in the case where the copper (Cu) film was used as the main conductive film.

It was also found that when the melting point of the adjacent conductive film is not less than 1.4 times that of copper (Cu), the adhesive fracture energy U is not dependent on the lattice mismatching A and B, as shown in FIGS. 4 and 5. FIG. 4 is obtained by preparing a map in which the lattice mismatching A is taken as the abscissa and the amount in which the lattice mismatching B is multiplied by (ap/bp) is taken as the ordinate, by setting the values of A and B so as to cover this map, and by calculating the value of the adhesive fracture energy U by the molecular dynamic simulation.

In FIG. 4, the region on the inner side of the boundary line, i.e., the region close to the origin, is a region where the adhesive fracture energy U is greater than 0.5 time $U_{Cu}$, and the adhesive fracture is unlikely to occur between the adjacent conductive film and the copper (Cu) film. Here, $U_{Cu}$ denotes the adhesive fracture energy between the copper (Cu) film and the copper (Cu) film. Also, the region on the outer side of the boundary line is a region where the adhesive fracture energy U is smaller than 0.5 time $U_{Cu}$, and the adhesive fracture is likely to occur between the adjacent conductive film and the copper (Cu) film.

FIG. 5 shows the result of conducting examination of the change of adhesive fracture energy along the broken line in FIG. 4 to closely study the lattice mismatching dependence of the adhesive fracture energy U. Referring to FIG. 5, since the adhesive fracture energy changes sharply in the vicinity of $U/U_{Cu}=0.5$, the adhesive fracture prevention effect becomes noticeable by using this level as a boundary. It can be seen that titanium nitride (TiN) and the like, whose adhesive fracture with respect to copper (Cu) has been a problem, are located on the side where $U/U_{Cu}$ is smaller than 0.5.

FIG. 4 reveals that tungsten (W) and tantalum (Ta) are also located outside the boundary line of $U/U_{Cu}=0.5$. Meanwhile, rhodium (Rh), ruthenium (Ru), iridium (Ir), osmium (Os), and platinum (Pt) are located on the inner side, i.e., on the origin side, of the boundary line in FIG. 4, and it can be seen that these elements are effective in the improvement of adhesion to the copper (Cu) film.

If the boundary line in FIG. 4 is linearly approximated, the boundary line can be expressed as $\{A+B\times(ap/bp)\}=13\%$, so that it can be said that the adhesion between the adjacent conductive film and the copper (Cu) film is strong when the inequality $\{A+B\times(ap/bp)\}<13\%$ is satisfied. Nevertheless, even if this inequality is satisfied, it can be seen from FIG. 3 that in a case where the melting point of the main constituent element of the adjacent conductive film is smaller than 1.4 times that of copper (Cu), the diffusion of the element constituting the adjacent conductive film becomes active and accelerates the diffusion of the copper (Cu) atoms. As a result the adhesive fracture energy U becomes small, and the adhesive fracture is liable to take place between the adjacent conductive film and the copper (Cu) film. For example, in the case of nickel (Ni) having a melting point which is 1.27 times the melting point of copper (Cu), or 1358°K, the lattice mismatching A and B with copper (Cu) is $\{A+B\times(ap/bp)\}=4\%$, and although the aforementioned inequality $\{A+B\times(ap/bp)\}<13\%$ is satisfied, the adhesive fracture energy is small at 0.4 $U_{Cu}$, and the adhesion does not improve. The effect of this embodiment seen in the result of the above-described simulation can be demonstrated even if the simulation conditions such as the temperature and the film thickness are changed.

In this embodiment, since settings are provided such that the lattice mismatching A and B between the adjacent conductive film and the main conductive film satisfies the aforementioned inequality $\{A+B\times(ap/bp)\}<13\%$, and that the melting point of the main constituent element of the adjacent conductive film is not less than 1.4 times that of the main constituent element of the main conductive film, the adhesion between the adjacent conductive film and the main conductive film is strong. This effect is particularly noticeable in the case where the main conductive film is the Cu film formed by plating or CVD.

Next, a description will be given of the aforementioned second effect of improvement of adhesion.

The present inventors examined through a molecular dynamic simulation how the adhesive fracture energy between the adjacent conductive film and the insulating film changes by the added element contained in the adjacent conductive film.

Figure 6:
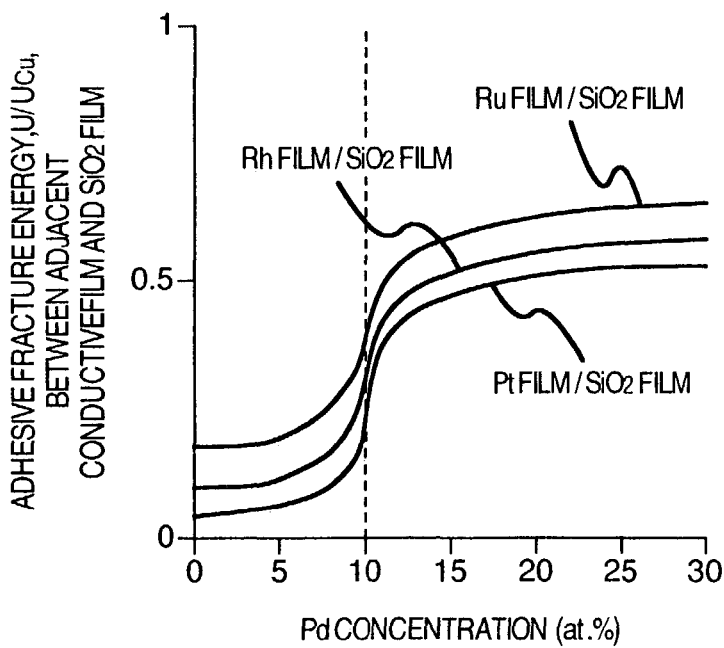
FIG. 6 is a diagram illustrating the dependence of the adhesive fracture energy between the adjacent conductive film and the silicon dioxide film on the concentration of palladium (Pd) in a case where palladium (Pd) was contained as an added element in the adjacent conductive films respectively composed of rhodium (Rh), ruthenium (Ru), and platinum (Pt)

FIG. 6 is a graph illustrating the change of the adhesive fracture energy with respect to the concentration of palladium (Pd) in a case where a simulation was performed in which, as an example, films, which contained palladium (Pd) as an added element in the adjacent conductive films respectively composed of rhodium (Rh), ruthenium (Ru), and platinum (Pt), were formed on the $SiO_2$ film at 900°K, and were allowed to cool to 300°K. The film thickness was set to 3 nm for both the adjacent conductive film and the $SiO_2$ film. The adhesive fracture energy occurring here is the energy necessary for causing adhesive fracture between the adjacent conductive film and the silicon dioxide film ($SiO_2$ film). This graph reveals that if the concentration of palladium (Pd) becomes approximately 10 at. % (atomic percent) or more, the adhesive fracture energy increases sharply, and the adhesion between the adjacent conductive film and the silicon dioxide film ($SiO_2$ film) improves.

Figure 7:
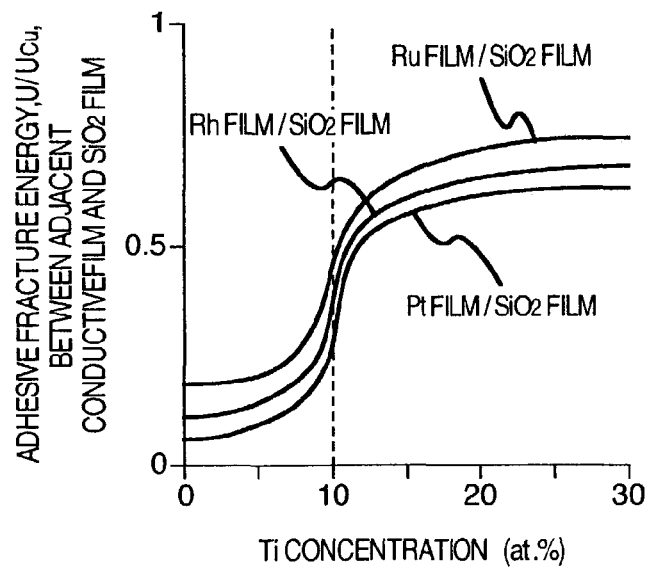
FIG. 7 is a diagram illustrating the dependence of the adhesive fracture energy between the adjacent conductive film and the silicon dioxide film on the concentration of titanium (Ti) in a case where titanium (Ti) was contained as an added element in the adjacent conductive films respectively composed of rhodium (Rh), ruthenium (Ru), and platinum (Pt)

FIG. 7, similarly, shows the change of the adhesive fracture energy with respect to the concentration of titanium (Ti) in a case where titanium (Ti) was contained as an added element in the adjacent conductive films respectively composed of rhodium (Rh), ruthenium (Ru), and platinum (Pt). It can also be seen from this graph that, in the case where the added element is titanium (Ti), if the concentration becomes approximately 10 at. % or more, the adhesive fracture energy increases sharply, thereby improving the adhesion between the adjacent conductive film and the silicon dioxide film ($SiO_2$ film).

From FIGS. 6 and 7, it can be seen that if the concentration of the added element becomes approximately 15 at. %, the adhesive fracture energy becomes substantially fixed, and the effect of improvement of adhesion becomes saturated.

Figure 8:
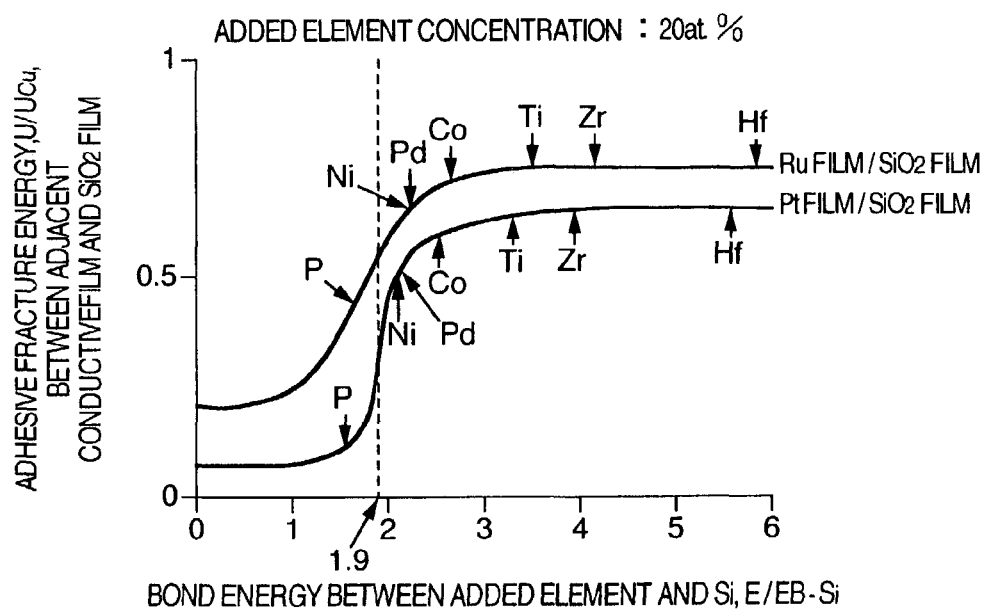
FIG. 8 is a diagram illustrating the dependence of the adhesive fracture energy between the adjacent conductive film and the silicon dioxide film on the bond energy between the added element and silicon (Si) in a case where the concentration of the added element was set to 20 at. %.

Next, FIG. 8 shows a graph in which the bond energy between the added element and silicon (Si) is taken as the abscissa, and the adhesive fracture energy in a case where the concentration of the added element was set to 20 at. % is taken as the ordinate, to examine what added elements improve the adhesion to the silicon dioxide film ($SiO_2$ film). In this graph, EB-Si on the abscissa represents the bond energy between the main constituent element of the adjacent conductive film and silicon (Si). From FIG. 8, it was found that an added element whose bond energy with silicon (Si) is not less than approximately 1.9 times that of the main constituent element of the adjacent conductive film and silicon (Si) improves the adhesion to the silicon dioxide film ($SiO_2$ film).

Specifically, palladium (Pd), cobalt (Co), nickel (Ni), titanium (Ti), hafnium (Hf), and zirconium (Zr) are effective in the improvement of adhesion to the silicon dioxide film ($SiO_2$ film). However, in a case where the adhesion between the adjacent conductive film and the copper (Cu) film becomes weak due to the fact that the added element is contained in the adjacent conductive film, such elements are not suitable as the added elements, so that elements corresponding to such a case must be eliminated.

Hereafter, a description will be given of the effect of the added element on the adhesion to the copper (Cu) film.

As shown in FIGS. 4 and 5, the adhesion between the adjacent conductive film and the copper (Cu) film improves by using as the main constituent element of the adjacent conductive film rhodium (Rh), ruthenium (Ru), iridium (Ir), osmium (Os), or platinum (Pt) whose lattice mismatching with copper (Cu) is small, so that it can be said that an added element which does not make this lattice mismatching large is suitable. Namely, it is important not to disarray the atomic arrangement of rhodium (Rh), ruthenium (Ru), iridium (Ir), osmium (Os), and platinum (Pt), and an added element whose atomic radius is close to their atomic radii is suitable.

To closely examine this state, the influence of the added element on the adhesion to the copper (Cu) film was examined by taking as an example the case in which ruthenium (Ru) was used as the main constituent element of the adjacent conductive film, and by taking as the abscissa the difference in the atomic radius between the added element and ruthenium (Ru) and by taking as the ordinate the adhesive fracture energy between the ruthenium (Ru) film and the copper (Cu) film. The result is shown in FIG. 9.

Figure 9:
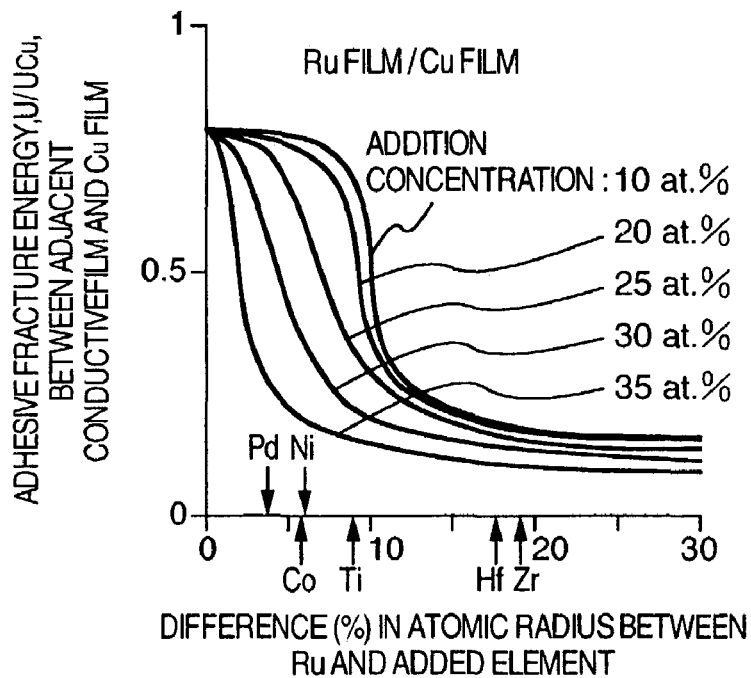
FIG. 9 is a diagram illustrating the dependence of the adhesive fracture energy between a ruthenium (Ru) film and the copper (Cu) film on the difference in the atomic radius between the added element and ruthenium (Ru) in a case where ruthenium (Ru) was used as the main constituent element of the adjacent conductive film.

As can be seen from the graphs in FIG. 9, added elements whose differences in the atomic radius are not less than 10% weaken the adhesion to the copper (Cu) film even if their concentrations are not more than 20 at. %. Specifically, hafnium (Hf) and zirconium (Zr) correspond to this case. Although these elements have large bond energies with silicon (Si), as shown in FIG. 8, and are effective in the improvement of adhesion to the silicon dioxide film ($SiO_2$ film), their differences in the atomic radius with ruthenium (Ru) are large, disarraying the atomic arrangement of ruthenium (Ru), so that they weaken the adhesion to the copper (Cu) film.

By taking into consideration the findings in both FIGS. 8 and 9, as added elements for improving the adhesion between the silicon dioxide film ($SiO_2$ film) and the ruthenium (Ru) film while strongly maintaining the adhesion between the copper (Cu) film and the ruthenium (Ru) film, it is possible to cite palladium (Pd), cobalt (Co), nickel (Ni), and titanium (Ti) whose differences in the atomic radius with ruthenium (Ru) are not more than 10%, and whose bond energies with silicon (Si) are not less than 1.9 times the bond energy between ruthenium (Ru) and silicon (Si). Since rhodium (Rh), ruthenium (Ru), iridium (Ir), osmium (Os), and platinum (Pt) respectively have atomic radii close to that of ruthenium (Ru), it is possible to cite similar added elements for them as well.

FIG. 9 reveals that in the case where palladium (Pd), cobalt (Co), nickel (Ni), and titanium (Ti) are added, the adhesion to the copper (Cu) film becomes weak if the concentration becomes 30 at. % or more. By taking into consideration both FIGS. 6 and 7, the concentrations of palladium (Pd), cobalt (Co), nickel (Ni), and titanium (Ti) are preferably not less than 10 at. % and not more than 25 at. %. The effect of this embodiment seen in the result of the above-described simulation can be demonstrated even if the simulation conditions such as the temperature and the film thickness are changed.

Another effect of the semiconductor device in accordance with the first embodiment of the invention is that the stress in the adjacent conductive films 14a, 14b, 16a, 16b, 19, 22a and 22b is reduced by the inclusion of the added element. Therefore, defects such as cracks become difficult to occur.

Figure 10:
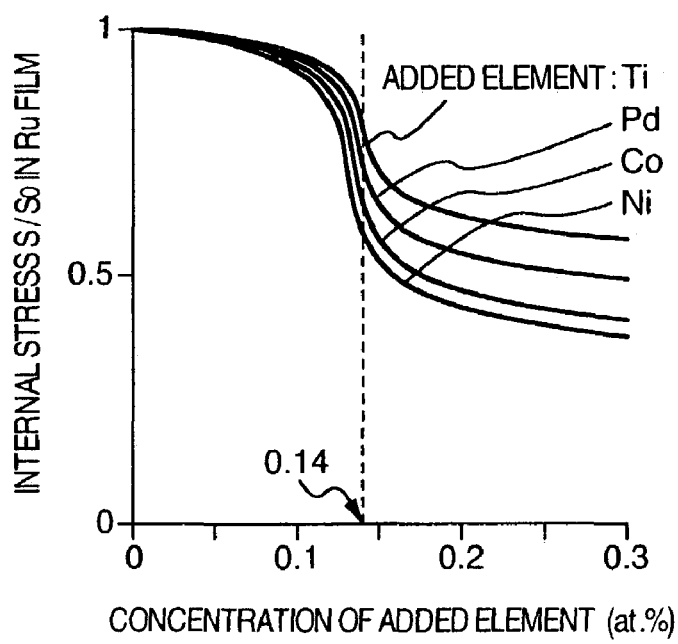
FIG. 10 is a diagram illustrating the dependence of the internal stress in the ruthenium (Ru) film on the concentration of the added element in a case where ruthenium (Ru) film was used as the main constituent element of the adjacent conductive film and palladium (Pd), cobalt (Co), nickel (Ni), and titanium (Ti) were respectively used as the added elements.

An examination was made through a molecular dynamic simulation as to how the internal stress in the adjacent conductive film changes due to the added element contained in the adjacent conductive film. FIG. 10 is a graph illustrating the change of the internal stress S remaining in the Ru film with respect to the concentration of the added element in a case where a simulation was performed in which, as an example, films, which respectively contained palladium (Pd), cobalt (Co), nickel (Ni), and titanium (Ti) as added elements in ruthenium (Ru), were formed on the $SiO_2$ film at 900°K, and were allowed to cool to 300°K. The film thickness was set to 3 nm for both the Ru film and the $SiO_2$ film. In FIG. 10, $S_0$ denotes the internal stress in the case where the added element was not contained.

From FIG. 10, it can be seen that the internal stress is reduced if the concentrations of the added elements are not less than approximately 0.14 at. %. FIG. 10 reveals that, of the above four elements, nickel (Ni) and cobalt (Co) having lower melting points are particularly effective in the reduction of the internal stress. Since palladium (Pa) and titanium (Ti) have fairly lower melting points than ruthenium (Ru), their effect of reducing the internal stress is shown in FIG. 10.

Figure 11:
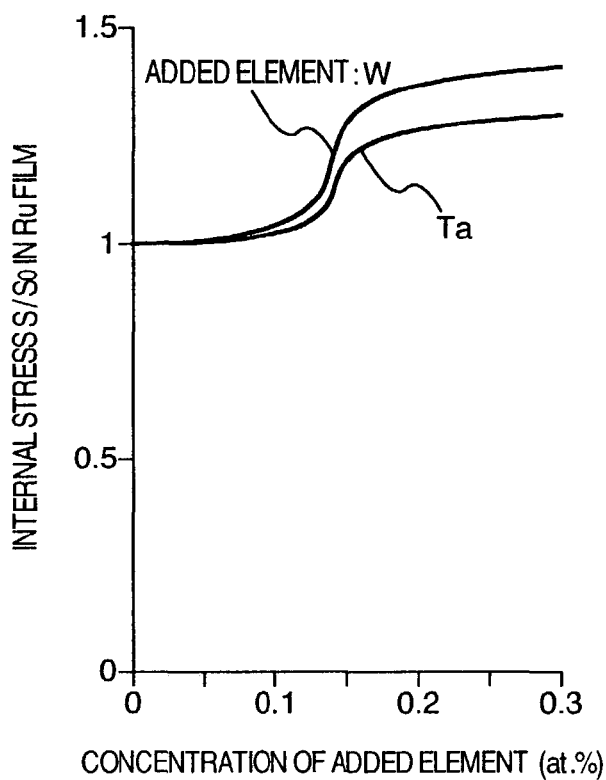
FIG. 11 is a diagram illustrating the dependence of the internal stress in the ruthenium (Ru) film on the concentration of the added element in a case where ruthenium (Ru) film was used as the main constituent element of the adjacent conductive film and tungsten (W) and tantalum (Ta) were respectively used as the added elements.

In a case where tungsten (W) and tantalum (Ta) whose melting points are higher than ruthenium (Ru) are instead added for comparison's sake, the internal stress increases together with the concentration of the added element as shown in FIG. 11. As can be seen from FIG. 11, these elements are not effective in the reduction of the internal stress. By also taking FIG. 9 into consideration, it can be said that the concentrations of the added elements, palladium (Pd), cobalt (Co), nickel (Ni), and titanium (Ti), are preferably not less than 0.14 at. % and not more than 25 at. %. The effect of this embodiment, as seen in the result of the above-described simulation, can be demonstrated even if the simulation conditions such as the temperature and the film thickness are changed.

Still another effect of the semiconductor device in accordance with the first embodiment of the invention is that the electromigration resistance of the conductor film improves. As an example, a description will be given of the effect in the case where the main conductive film is the copper (Cu) film. Although, in FIG. 5, referred to hereinabove, the effect of the lattice mismatching exerted on the adhesive fracture energy is obtained as a result of the molecular dynamic simulation, it is possible to examine the effect of the lattice mismatching exerted on the diffusion coefficient of the copper (Cu) atom through a simulation similar thereto.

Figure 12:
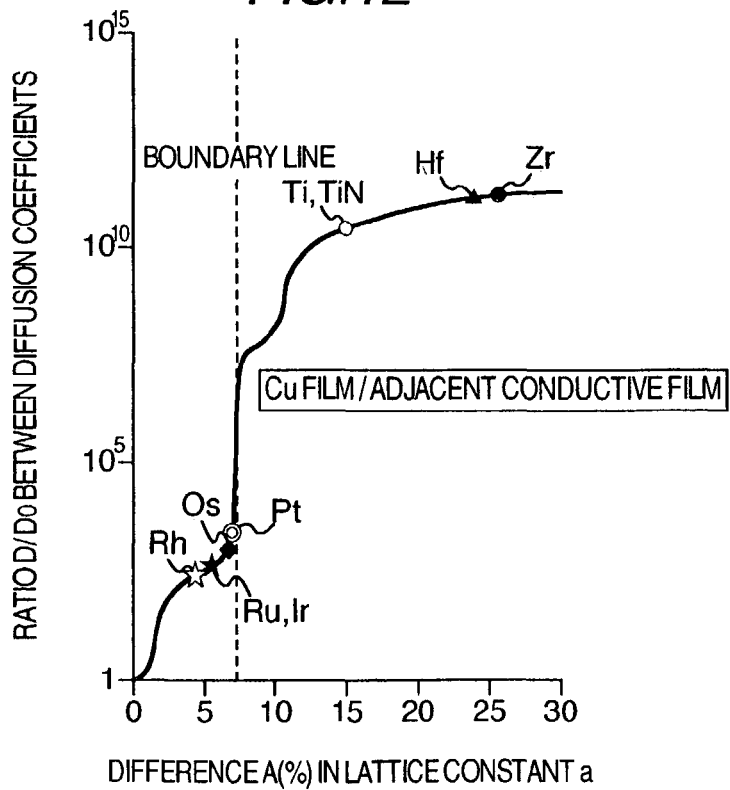
FIG. 12 is a diagram illustrating along the broken line in FIG. 4 the effect of lattice mismatching exerted on the diffusion coefficient of the copper (Cu) atom in the case where the copper (Cu) film was used as the main conductive film.

FIG. 12 shows a graph in which the lattice mismatching A is taken as the abscissa and the diffusion coefficient of the copper (Cu) atom is taken as the ordinate in the same way as FIG. 5. It should be noted, however, that D denotes the diffusion coefficient of the copper (Cu) atom in the copper (Cu) film having the adjacent conductive film as a substrate, and $D_0$ denotes a diffusion coefficient in bulk copper (Cu).

It can be said that if the lattice mismatching becomes greater than the boundary line, the diffusion coefficient increases sharply, and the copper (Cu) atoms exhibit the tendency of mobility. If the atoms are mobile, voids and disconnections are liable to occur such as when the current has flowed; Namely, migration resistance belows low. On the other hand, in a region where the diffusion coefficient is small, the atoms are less mobile, so that it can be said that the migration resistance excels. As can be seen from the graph in FIG. 12, rhodium (Rh), ruthenium (Ru), iridium (Ir), osmium (Os), and platinum (Pt) are included in the region where the diffusion coefficient is small. Accordingly, in this embodiment, since rhodium (Rh), ruthenium (Ru), iridium (Ir), osmium (Os), and platinum (Pt) whose lattice mismatching with copper (Cu) is small are used as the main constituent elements of the conductor film adjacent to the conductor film having copper (Cu) as the main constituent element, the migration resistance improves.

With respect to a still further effect of the semiconductor device in accordance with the first embodiment, in the case where the copper (Cu) film is used as the main conductive film, the adjacent conductive film has as its main constituent element at least one kind of element selected from rhodium (Rh), ruthenium (Ru), iridium (Ir), osmium (Os) and platinum (Pt), and contains as an added element at least one kind of element selected from palladium (Pd), cobalt (Co), nickel (Ni), and titanium (Ti). As a result the copper (Cu) atoms in the adjacent conductive film become difficult to be diffused, thereby improving the reliability of the semiconductor device.

Although, in this embodiment, an example has been shown in which in the case where a copper (Cu) film is used as the main conductive film, the adjacent conductive film is a film which has as its main constituent element at least one kind of element selected from rhodium (Rh), ruthenium (Ru), iridium (Ir), osmium (Os), and platinum (Pt), and contains as an added element at least one kind of element selected from palladium (Pd), cobalt (Co), nickel (Ni), and titanium (Ti), the advantages of this embodiment can be obtained, also, even if the adjacent conductive film contains other additional elements apart from these elements. Furthermore, the adjacent conductive film may be a film which has as its main constituent material at least one material selected from rhodium oxide, ruthenium oxide, iridium oxide, and osmium oxide, and may contain as an added element at least one kind of element selected from palladium (Pd), cobalt (Co), nickel (Ni), and titanium (Ti). In addition, even if this adjacent conductive film contains other added elements apart from these elements, the effects of this embodiment can still be obtained.

Figure 13:
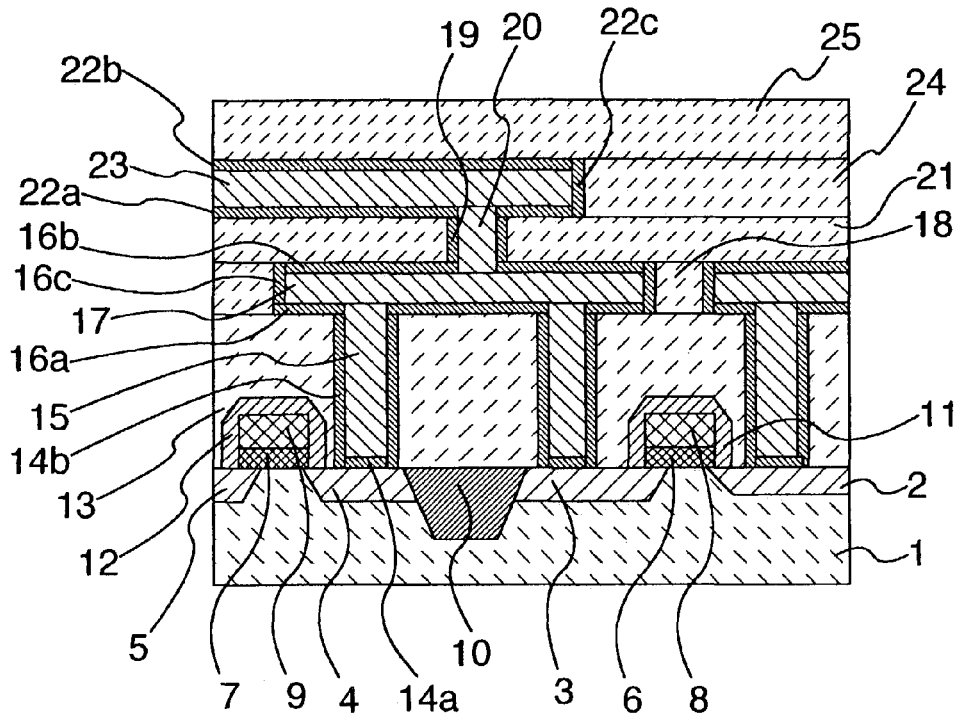
FIG. 13 is a cross-sectional view of principal portions of a semiconductor device in accordance with a second embodiment of the invention.

Next, FIG. 13 shows a cross-sectional structure of principal portions of a semiconductor device in accordance with a second embodiment of the invention. The difference of the second embodiment from the first embodiment is that the side walls of the main conductive film 17 and the side walls of the main conductive film 23 in the first embodiment are not coated, and the side walls of the main conductive film 17 and the side walls of the main conductive film 23 in the second embodiment are respectively coated with adjacent conductive films 16c and adjacent conductive films 22c. Consequently, the structure provided in FIG. 13 is such that the constituent elements of the main conductive films 17 and 23 are prevented from becoming dispersed from the side walls to the insulating films 18 and 24.

Figure 14:
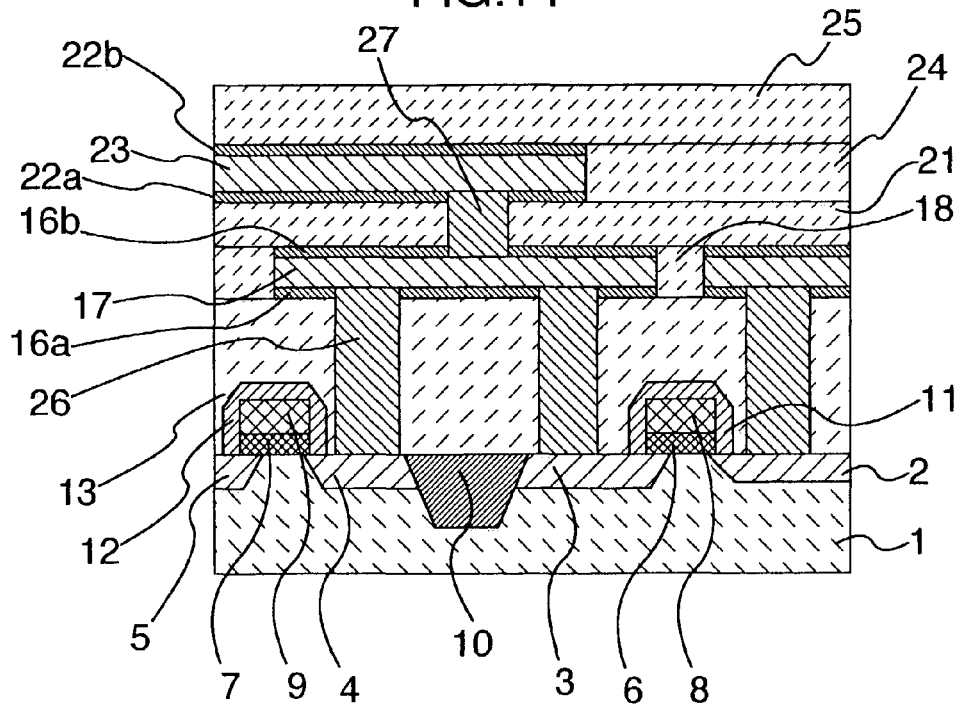
FIG. 14 is a cross-sectional view of principal portions of a semiconductor device in accordance with a third embodiment of the invention.

Next, FIG. 14 shows a cross-sectional structure of principal portions of a semiconductor device in accordance with a third embodiment of the invention. The differences of the third embodiment from the first embodiment are such that in the third embodiment the interconnection layer formed by the main conductive film 17 is connected to an uncoated conductive plug 26, and that the interconnection layer formed by the main conductive film 23 is connected to an uncoated conductive plug 27. Also, these conductive plugs 26 and 27 are respectively in contact with the main conductive films 17 and 23 and the insulating films 13 and 21. Therefore, to improve the reliability, it suffices if the constituent elements of the conductive plug 26 are selected such that all of the following requirements are met: (i) that the difference $\{|ap-an|/ap\} \times 100 = A(\%)$ between the short side "an" in the unit rectangular cell of the closest packed crystal plane formed by the main constituent element of the conductive plug 26 and the short side "ap" in the unit rectangular cell of the closest packed crystal plane formed by the main constituent element of the main conductive film 17 and the difference $\{|bp-bn|/bp\} \times 100 = B(\%)$ between the long side "bn" in the unit rectangular cell of the closest packed crystal plane formed by the main constituent element of the conductive plug 26 and the long side "bp" in the unit rectangular cell of the closest packed crystal plane formed by the main constituent element of the main conductive film 17 satisfy the inequality $\{A + B \times (ap/bp)\} < 13\%$, (ii) that the melting point of the main constituent element of the conductive plug 26 is not less than 1.4 times that of the main constituent element of the main conductive film 17, (iii) that the conductive plug 26 contains at least one different kind of element in addition to the main constituent element, (iv) that the difference between the atomic radius of at least one kind of added element among the different kinds of elements and the atomic radius of the main constituent element of the conductive plug 26 is not more than 10%, and (v) that the bond energy between the added element and silicon (Si) is not less than 1.9 times that of the main constituent element of the conductive plug 26 and silicon (Si). Specifically, in a case where the main conductive film 17 has the copper (Cu) film as its main constituent element, it suffices if the conductive plug 26 has as its main constituent element at least one kind of element selected from rhodium (Rh), ruthenium (Ru), iridium (Ir), osmium (Os), and platinum (Pt), and contains as an added element at least one kind of element selected from palladium (Pd), cobalt (Co), nickel (Ni), and titanium (Ti).

Similarly, to improve the adhesion between the conductive film plug 27 and the main conductive film 23 and the adhesion between the conductive film plug 27 and the insulating film 21, it suffices if the constituent elements of the conductive plug 27 are selected such that all of the following requirements are met: (i) that the difference $\{|ap-an|/ap\} \times 100 = A(\%)$ between the short side "an" in the unit rectangular cell of the closest packed crystal plane formed by the main constituent element of the conductive plug 27 and the short side "ap" in the unit rectangular cell of the closest packed crystal plane formed by the main constituent element of the main conductive film 23 and the difference $\{|bp-bn|/bp\} \times 100 = B(\%)$ between the long side "bn" in the unit rectangular cell of the closest packed crystal plane formed by the main constituent element of the conductive plug 27 and the long side "bp" in the unit rectangular cell of the closest packed crystal plane formed by the main constituent element of the main conductive film 17 satisfy the inequality $\{A + B \times (ap/bp)\} < 13\%$, (ii) that the melting point of the main constituent element of the conductive plug 27 is not less than 1.4 times that of the main constituent element of the main conductive film 23, (iii) that the conductive plug 27 contains at least one different kind of element in addition to the main constituent element, (iv) that the difference between the atomic radius of at least one kind of added element among the different kinds of elements and the atomic radius of the main constituent element of the conductive plug 27 is not more than 10%, and (v) that the bond energy between the added element and silicon (Si) is not less than 1.9 times that of the main constituent element of the conductive plug 27 and silicon (Si). Specifically, in a case where the main conductive film 23 has the copper (Cu) film as its main constituent element, it suffices if the conductive plug 27 has as its main constituent element at least one kind of element selected from rhodium (Rh), ruthenium (Ru), iridium (Ir), osmium (Os), and platinum (Pt), and contains as an added element at least one kind of element selected from palladium (Pd), cobalt (Co), nickel (Ni), and titanium (Ti). As a result, since the conductive plugs 26 and 27 are provided with melting points higher than those of the main conductive films 17 and 23, a structure such as that shown in FIG. 14 excels in thermal resistance and migration resistance.

Although, in FIG. 14, the case has been shown in which the conductive plugs 26 and 27 are respectively brought into direct contact with the insulating films 13 and 21, the structure may be such that an intermediate film is formed between the conductive plug 26 and the insulating film 13 and between the conductive plug 27 and the insulating film 21.

Figure 15:
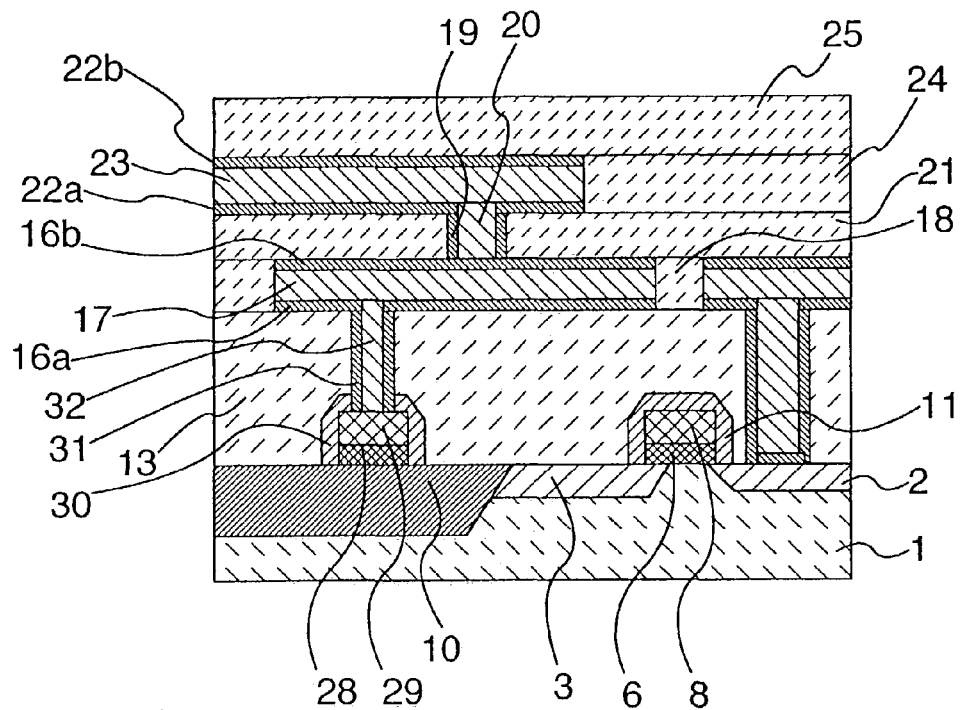
FIG. 15 is a cross-sectional view of principal portions of a semiconductor device in accordance with a fourth embodiment of the invention.

Further, FIG. 15 shows a cross-sectional structure of principal portions of a semiconductor device in accordance with a fourth embodiment of the invention. The difference of the fourth embodiment from the first embodiment lies in that the interconnection layer formed by the main conductive film 17 in the fourth embodiment is connected via a conductive plug 32 to a gate electrode 29 formed on a gate insulating film 28. In this case, since the gate electrode 29 is in contact with the conductive plug 32 and an insulating film 30, to improve the reliability it suffices if the constituent elements of the gate electrode 29 are selected such that all of the following requirements are met: (i) that the difference {|ap−an|/ap}×100=A(%) between the short side "an" in the unit rectangular cell of the closest packed crystal plane formed by the main constituent element of the gate electrode 29 and the short side "ap" in the unit rectangular cell of the closest packed crystal plane formed by the main constituent element of the conductive plug 32 and the difference {|bp−bn|/bp}×100=B(%) between the long side "bn" in the unit rectangular cell of the closest packed crystal plane formed by the main constituent element of the gate electrode 29 and the long side "bp" in the unit rectangular cell of the closest packed crystal plane formed by the main constituent element of the conductive plug 32 satisfy the inequality {A+B×(ap/bp)}<13%, (ii) that the melting point of the main constituent element of the gate electrode 29 is not less than 1.4 times that of the main constituent element of the conductive plug 32, (iii) that the gate electrode 29 contains at least one different kind of element in addition to the main constituent element, (iv) that the difference between the atomic radius of at least one kind of added element among the different kinds of elements and the atomic radius of the main constituent element of the gate electrode 29 is not more than 10%, and (v) that the bond energy between the added element and silicon (Si) is not less than 1.9 times that of the main constituent element of the gate electrode 29 and silicon (Si). Specifically, in a case where the conductive plug 32 has the copper (Cu) film as its main constituent element, it suffices if the gate electrode 29 has as its main constituent element at least one kind of element selected from rhodium (Rh), ruthenium (Ru), iridium (Ir), osmium (Os), and platinum (Pt), and contains as an added element at least one kind of element selected from palladium (Pd), cobalt (Co), nickel (Ni), and titanium (Ti).

Figure 16:
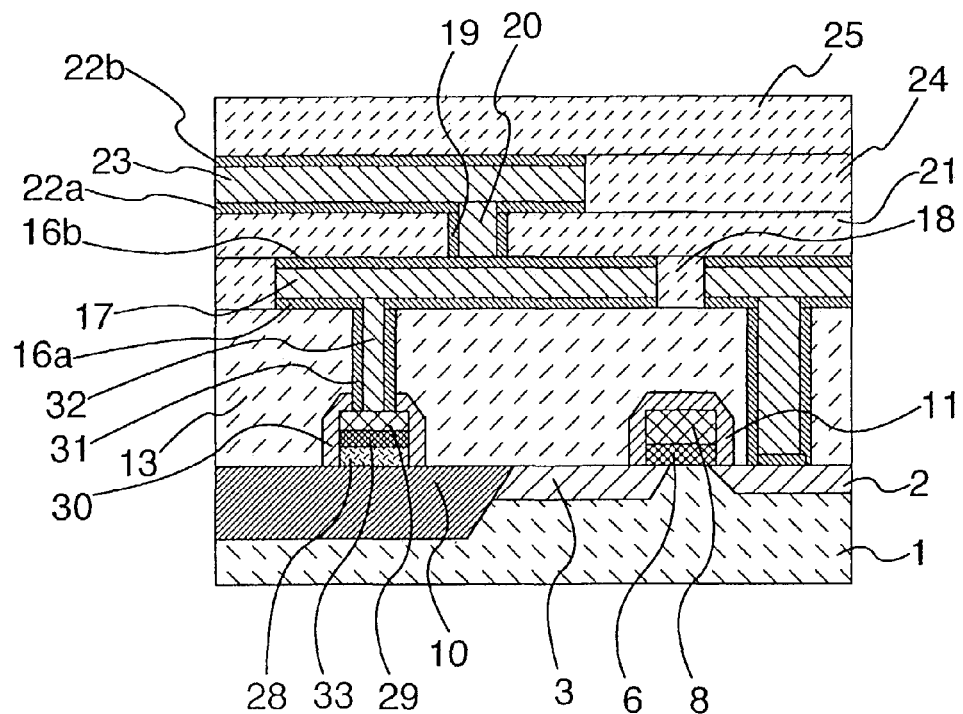
FIG. 16 is a cross-sectional view of principal portions of a semiconductor device in accordance with a fifth embodiment of the invention.

Next, FIG. 16 shows a cross-sectional structure of principal portions of a semiconductor device in accordance with a fifth embodiment of the invention. The difference of the fifth embodiment from the fourth embodiment lies in that the gate electrode in the fifth embodiment has a laminated structure comprised of the conductive film 29 and a conductive film 33. The conductive film 29 has interfaces of contact with the conductive plug 32 and the conductive film 33. For example, in a case where the conductive film 33 is formed of polycrystalline silicon, and the conductive plug 32 has copper (Cu) as its main constituent element, to improve the reliability it suffices if the conductive film 29 has as its main constituent element at least one kind of element selected from rhodium (Rh), ruthenium (Ru), iridium (Ir), osmium (Os), and platinum (Pt), and contains as an added element at least one kind of element selected from palladium (Pd), cobalt (Co), nickel (Ni), and titanium (Ti).

Figure 17:
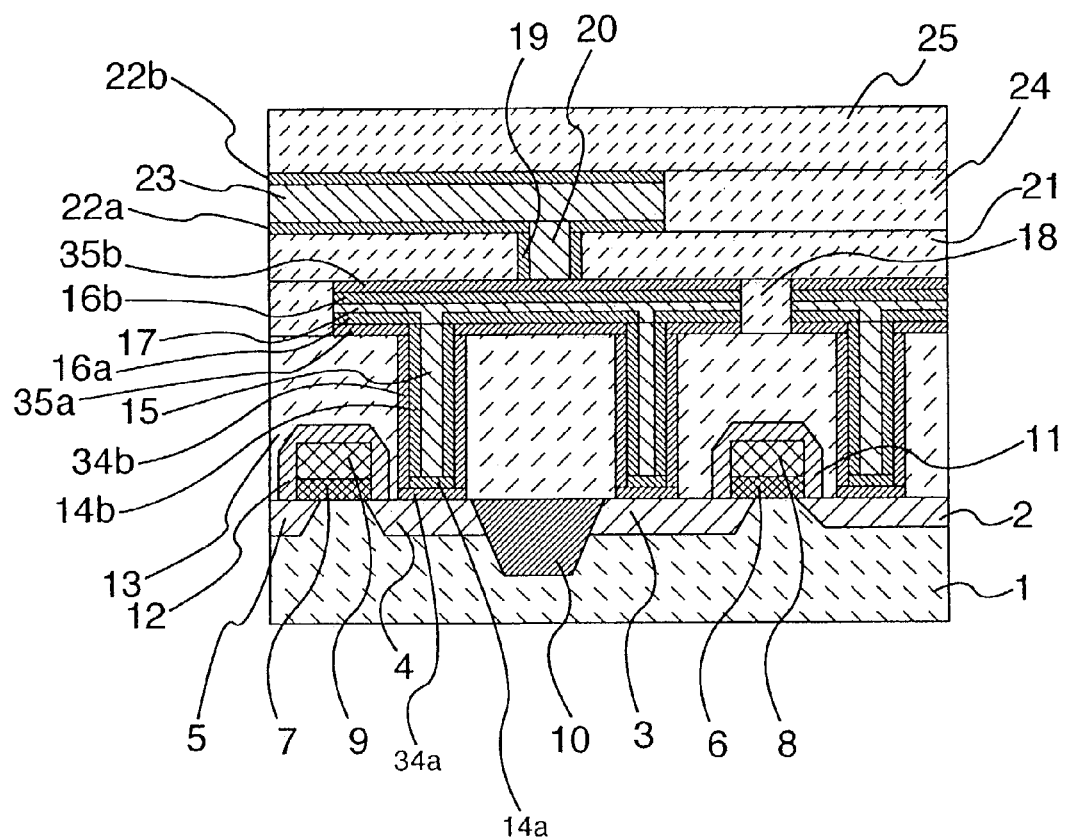
FIG. 17 is a cross-sectional view of principal portions of a semiconductor device in accordance with a sixth embodiment of the invention.

Next, FIG. 17 shows a cross-sectional structure of principal portions of a semiconductor device in accordance with a sixth embodiment of the invention. The differences of the sixth embodiment from the first embodiment lie in that the structure provided, according to the sixth embodiment, is such that the adjacent conductive films 14a and 14b are respectively in contact with adjacent conductive films 34a and 34b, and that the adjacent conductive films 16a and 16b are respectively in contact with adjacent conductive films 35a and 35b. As the adjacent films 34a, 34b, 16a, and 16b, a conductive film such as titanium nitride (TiN), tantalum (Ta), tantalum nitride (TaN), palladium (Pd), cobalt (Co), nickel (Ni), titanium (Ti), or the like, or an insulating film such as a silicon nitride film is used. Consequently, the structure provided is such that, as compared with the first embodiment, the constituent elements of the main conductive films 15 and 17 can be more strongly prevented from being dispersed to the insulating films 13 and 18 and the like.

As described above, as the main constituent elements of the adjacent conductive films, rhodium (Rh), ruthenium (Ru), iridium (Ir), osmium (Os), platinum (Pt), and the like are suitable, but ruthenium (Ru), in particular, excels among them in terms of workability. In addition, palladium (Pd), cobalt (Co), nickel (Ni), titanium (Ti), and the like are suitable as the added elements. However, of these four added elements, palladium (Pd) has the smallest difference in the atomic radius with ruthenium (Ru) as shown in FIG. 9, palladium (Pd) is unlikely to disarray the atomic arrangement of ruthenium (Ru) and excels in that it does not increase the electrical resistance even when added. Thus it can be said that palladium (Pd) is the most suitable added element in the case where ruthenium (Ru) is used as the main constituent element of the adjacent conductive film. Further, as shown in FIG. 8, titanium (Ti) has the largest bond energy with silicon (Si), and is most effective in the improvement of adhesion to the insulating film containing silicon (Si). In addition, nickel (Ni) and cobalt (Co) are most effective in reducing the internal stress, as shown in FIG. 10.

In addition, as for the portion which has been described by citing copper (Cu) as an example, even if gold (Au) or silver (Ag) is used instead of copper (Cu), the above-described effects can be obtained, also, by using rhodium (Rh), ruthenium (Ru), iridium (Ir), osmium (Os), or platinum (Pt) as the main constituent element of the adjacent film. Further, in the case where platinum (Pt) having a high melting point is used instead of copper (Cu), if osmium is used instead of using rhodium (Rh), ruthenium (Ru), iridium (Ir), osmium (Os), or platinum (Pt), the above-described effects can be obtained.

In accordance with the invention, since the adhesion between the adjacent conductive film and the insulating film can be improved, it is possible to provide a highly reliable semiconductor device in which adhesive fracture is difficult to occur. In addition, it is possible to provide a highly reliable semiconductor device in which defects such as cracks are difficult to occur in the multilayer structure.

Furthermore, it is possible to provide a highly reliable semiconductor device in which voids and disconnections due to migration are difficult to occur.

The invention claimed is:
1. A semiconductor device comprising:
a semiconductor substrate;
a gate electrode formed on said semiconductor substrate;
a diffusion layer formed within said semiconductor substrate and corresponding to said gate electrode;
a connection layer disposed above said gate electrode through an insulating layer; and
a plug connected electrically with said connection layer and said diffusion layer, wherein said plug comprises a main conductive film and an adjacent conductive film disposed outside of said main conductive film, and said main conductive film includes copper as a main constituent element, and said adjacent conductive film includes as a main constituent element at least one element selected from a group consisting of ruthenium, iridium, and osmium.

2. A semiconductor device comprising:

a semiconductor substrate;

a gate electrode formed on said semiconductor substrate;

a diffusion layer formed within said semiconductor substrate and corresponding to said gate electrode;

a connection layer disposed above said gate electrode through an insulating layer; and a plug connected electrically with said connection layer and said diffusion layer, wherein said plug comprises a main conductive film and an adjacent conductive film disposed outside of said main conductive film, and said main conductive film includes copper as a main constituent element, said adjacent conductive film includes as a main constituent element at least one element selected from a group consisting of rhodium, ruthenium, iridium, and osmium and platinum, wherein said adjacent conductive film includes as an added constituent element at least one element selected from a group consisting of palladium, cobalt, nickel and titanium.

3. A semiconductor device according to claim 2, wherein said adjacent conductive film includes said added constituent element with said at least one element selected from a group consisting of palladium, cobalt, nickel and titanium with a concentration of not less than 0.14 at. % and not more than 25 at. %.

4. A semiconductor device comprising:

a semiconductor substrate;

a gate electrode formed on said semiconductor substrate;

a diffusion layer formed within said semiconductor substrate and corresponding to said gate electrode;

a connection layer disposed above said gate electrode through an insulating layer; and a plug connected electrically with said connection layer and said diffusion layer, wherein said connection layer comprises a main conductive film and an adjacent conductive film disposed outside of said main conductive film, and said main conductive film includes copper as a main constituent element, and said adjacent conductive film includes as a main constituent element at least one element selected from a group consisting of ruthenium, iridium, and osmium.

5. A semiconductor device comprising:

a semiconductor substrate;

a gate electrode formed on said semiconductor substrate;

a diffusion layer formed within said semiconductor substrate and corresponding to said gate electrode;

a connection layer disposed above said gate electrode through an insulating layer; and a plug connected electrically with said connection layer and said diffusion layer, wherein said connection layer comprises a main conductive film and an adjacent conductive film disposed outside of said main conductive film, and said main conductive film includes copper as a main constituent element, and said adjacent conductive film includes as a main constituent element at least one element selected from a group consisting of rhodium, ruthenium, iridium, osmium and platinum, wherein said adjacent conductive film includes as an added constituent element at least one element selected from a group consisting of palladium, cobalt, nickel and titanium.

6. A semiconductor device according to claim 5, wherein said adjacent conductive film includes said added constituent element with said at least one element selected from a group consisting of palladium, cobalt, nickel and titanium with a concentration of not less than 0.14 at. % and not more than 25 at. %.

7. A semiconductor device comprising:

a semiconductor substrate;

a gate electrode formed on said semiconductor substrate;

a diffusion layer formed within said semiconductor substrate and corresponding to said gate electrode;

a connection layer disposed above said gate electrode through an insulating layer; and a plug connected electrically with said connection layer and said gate electrode, wherein said plug includes copper as a main constituent element, and said gate electrode includes as a main constituent element at least one element selected from a group consisting of ruthenium, iridium, osmium and, as an added element, at least one element selected from palladium (Pd), cobalt (Co), nickel (Ni) and titanium (Ti).

8. A semiconductor device comprising:

a semiconductor substrate;

a gate electrode formed on said semiconductor substrate;

a diffusion layer formed within said semiconductor substrate and corresponding to said gate electrode;

a connection layer disposed above said gate electrode through an insulating layer; and a plug connected electrically with said connection layer and said gate electrode, wherein said plug includes copper as a main constituent element, and said gate electrode includes as a main constituent element at least one element selected from a group consisting of rhodium, ruthenium, iridium, osmium and platinum, wherein said gate electrode includes as an added constituent element at least one element selected from a group consisting of palladium, cobalt, nickel and titanium.

9. A semiconductor device according to claim 8, wherein said gate electrode includes said added constituent element with said at least one element selected from a group consisting of palladium, cobalt, nickel and titanium with a concentration of not less than 0.14 at. % and not more than 25 at. %.

10. A semiconductor device comprising:

a semiconductor substrate;

a gate electrode formed on said semiconductor substrate;

a diffusion layer formed within said semiconductor substrate and corresponding to said gate electrode;

a connection layer disposed above said gate electrode through an insulating layer; and a plug connected electrically with said connection layer and said gate electrode, wherein said plug includes copper as a main constituent element, and said gate electrode includes a first conductive film and a second conductive film disposed at a position nearer to said plug than said first conductive film, and said first conductive film includes silicon, and said second conductive film includes as a main constituent element at least one element selected from a group consisting of ruthenium, iridium, osmium.

11. A semiconductor device comprising:
a semiconductor substrate;
a gate electrode formed on said semiconductor substrate;
a diffusion layer formed within said semiconductor substrate and corresponding to said gate electrode;
a connection layer disposed above said gate electrode through an insulating layer; and
a plug connected electrically with said connection layer and said gate electrode,
wherein said plug includes copper as a main constituent element, and said gate electrode includes a first conductive film and a second conductive film disposed at a position nearer to said plug than said first conductive film, and
said first conductive film includes silicon, and
said second conductive film includes as a main constituent element at least one element selected from a group consisting of rhodium, ruthenium, iridium, osmium and platinum, wherein said second conductive film includes as an added constituent element at least one element selected from a group consisting of palladium, cobalt, nickel and titanium.

12. A semiconductor device according to claim 11, wherein said second conductive film includes said added constituent element with said at least one element selected from a group consisting of palladium, cobalt, nickel and titanium with a concentration of not less than 0.14 at. % and not more than 25 at. %.

* * * * *